(12) United States Patent
Vanko (10) Patent No.: US 9,209,724 B2
(45) Date of Patent: Dec. 8, 2015

(54) REVERSE ROTATION DETECTION AND OVERSPEED PROTECTION FOR POWER TOOL WITH BRUSHLESS MOTOR

(71) Applicant: Black & Decker Inc., Newark, NJ (US)

(72) Inventor: John C. Vanko, Timonium, MD (US)

(73) Assignee: Black & Decker Inc., New Britain, CT (US)

( * ) Notice: Subject to any disclaimer, the term of this patent is extended or adjusted under 35 U.S.C. 154(b) by 277 days.

(21) Appl. No.: 13/908,521

(22) Filed: Jun. 3, 2013

(65) Prior Publication Data

US 2014/0354203 A1 Dec. 4, 2014

(51) Int. Cl.
*H02P 1/04* (2006.01)
*H02P 3/18* (2006.01)
*H02K 29/08* (2006.01)
*H02P 6/00* (2006.01)
*B24B 23/00* (2006.01)
*H02P 29/00* (2006.01)
*H02P 23/00* (2006.01)
*H02P 29/02* (2006.01)

(52) U.S. Cl.
CPC .............. *H02P 6/003* (2013.01); *B24B 23/00* (2013.01); *H02P 23/0072* (2013.01); *H02P 29/0005* (2013.01); *H02P 29/021* (2013.01)

(58) Field of Classification Search
USPC ............ 318/40, 563, 68, 163, 257, 799, 782, 318/400.21
See application file for complete search history.

(56) References Cited

U.S. PATENT DOCUMENTS

| 3,883,785 | A |   | 5/1975  | Fulcher et al. |         |
|-----------|---|---|---------|----------------|---------|
| 3,921,047 | A |   | 11/1975 | Carter et al.  |         |
| 3,936,710 | A |   | 2/1976  | Tanikoshi      |         |
| 4,080,940 | A |   | 3/1978  | Fuzzell et al. |         |
| RE30,928  | E | * | 5/1982  | Fuzzell et al. | 123/333 |
| 4,622,500 | A |   | 11/1986 | Budelman, Jr.  |         |
| 4,629,980 | A |   | 12/1986 | Overby         |         |
| 4,709,195 | A |   | 11/1987 | Hellekson et al. |       |
| 5,072,166 | A |   | 12/1991 | Ehsani         |         |
| 5,382,890 | A |   | 1/1995  | Moh et al.     |         |
| 5,670,852 | A | * | 9/1997  | Chipperfield et al. | 318/250 |
| 5,747,953 | A | * | 5/1998  | Philipp        | 318/139 |
| 8,400,089 | B2 |  | 3/2013  | Bonner et al.  |         |

(Continued)

FOREIGN PATENT DOCUMENTS

EP 2626175 8/2013

*Primary Examiner* — Eduardo Colon Santana
*Assistant Examiner* — Iftekhar Mustafa
(74) *Attorney, Agent, or Firm* — Amir R. Rohani; Scott Markow (57) ABSTRACT

A reverse rotation detection module is provided for a power tool having an electric motor intended to rotate in a first direction but not an opposite second direction. The reverse rotation detection module is comprised of: a switching arrangement having a plurality of motor switches; three position sensors; a first latch circuit; a second latch circuit; and a motor driver module that is configured to receive the shutdown signal from the second latch circuit and discontinue driving the motor in response to the shutdown signal. An overspeed protection module is provided for a handheld power tool. The overspeed protection module is comprised of: an electric motor; a switching arrangement having a plurality of motor switches; a diode pump circuit; a comparator circuit; and a motor driver module that is configured to receive a shutdown signal from the comparator circuit and discontinue driving the motor in response to the shutdown signal.

9 Claims, 9 Drawing Sheets

(56) References Cited

U.S. PATENT DOCUMENTS

| | | | |
|---|---|---|---|
| 2003/0117095 A1* | 6/2003 | Gorti | 318/275 |
| 2004/0090195 A1 | 5/2004 | Motsenbocker | |
| 2007/0085496 A1* | 4/2007 | Philipp et al. | 318/139 |
| 2011/0056715 A1 | 3/2011 | Vanko et al. | |
| 2011/0254487 A1 | 10/2011 | Clothier et al. | |
| 2012/0068642 A1 | 3/2012 | Chen et al. | |
| 2012/0074878 A1 | 3/2012 | Pant et al. | |
| 2012/0279736 A1 | 11/2012 | Tanimoto et al. | |

* cited by examiner

REVERSE ROTATION DETECTION AND OVERSPEED PROTECTION FOR POWER TOOL WITH BRUSHLESS MOTOR

FIELD

The present disclosure relates to reverse rotation detection and overspeed protection for a power tool with a brushless motor.

BACKGROUND

Power tools may use brushless AC motors that have one or more phases. A given power tool may be intended to rotate in a first direction but not intended to rotate in an opposite second direction. Where not intended, the rotation in the opposite second direction, or reverse rotation, may result in the power tool accessories loosening and thus becoming detached from the power tool during normal operation. Therefore, there is a need to detect reverse rotation of the motor in such a power tool and to stop power tool operation if the reverse rotation is detected.

Brushless AC motors used in power tools may be capable of higher rotation speeds than are acceptable to other components of the power tool, including the attached accessories. There is, therefore, a need to detect an overspeed condition and to shut down the power tool when the overspeed condition is detected.

This section provides background information related to the present disclosure which is not necessarily prior art.

SUMMARY

The present disclosure pertains to a power tool having an electric motor. The power tool may include: an elongated housing configured to be grasped by a user; an output shaft at least partially contained in the housing; an electric motor drivably connected to the output shaft to impart rotary motion thereto; a switching arrangement interposed between the electric motor and a power source; and a motor driver module interfaces with the switches of the switching arrangement and operable to control switching operation of the motor switches.

In one aspect of the disclosure, the electric motor is intended to rotate in one direction but not in an opposite direction. A reverse rotation detection module monitors the rotational direction of the motor and generates a shutdown signal when the electric motor rotates in a direction that is opposite the intended rotational direction. To monitor rotation, the reverse rotation detection module is configured to receive signals from two or more position sensors. The motor driver module is configured to receive the shutdown signal from the reverse rotation detection module and discontinue driving the motor in response to the shutdown signal.

The reverse rotation detection module is comprised generally to a first latch circuit and a second latch circuit; and a motor driver module. The first latch circuit is configured to receive a first signal from a first one of the position sensors and a second signal from a second one of the position sensors and operates to generate an output state indicative of sequence of magnitude variations in the first signal relation to magnitude variations in the second signal. The second latch circuit is configured to receive the second signal from the second one of the position sensors, a third signal from a third one of the position sensors, and the output state from the first latch circuit. The second latch circuit operates to generate a shutdown signal in accordance with sequence of magnitude variations in the first latch output signal in relation to magnitude variations in the second and third signals.

In another aspect of this disclosure, an overspeed protection module also monitors the rotational motion of the motor. More specifically, the overspeed protection module monitors the speed of the motor and generates a shutdown signal when the speed of the motor exceeds a threshold. Likewise, the motor driver module is configured to receive the shutdown signal from the overspeed protection module and discontinue driving the motor in response to the shutdown signal.

In some arrangements, the overspeed protection module employs a diode pump circuit.

This section provides a general summary of the disclosure, and is not a comprehensive disclosure of its full scope or all of its features. Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
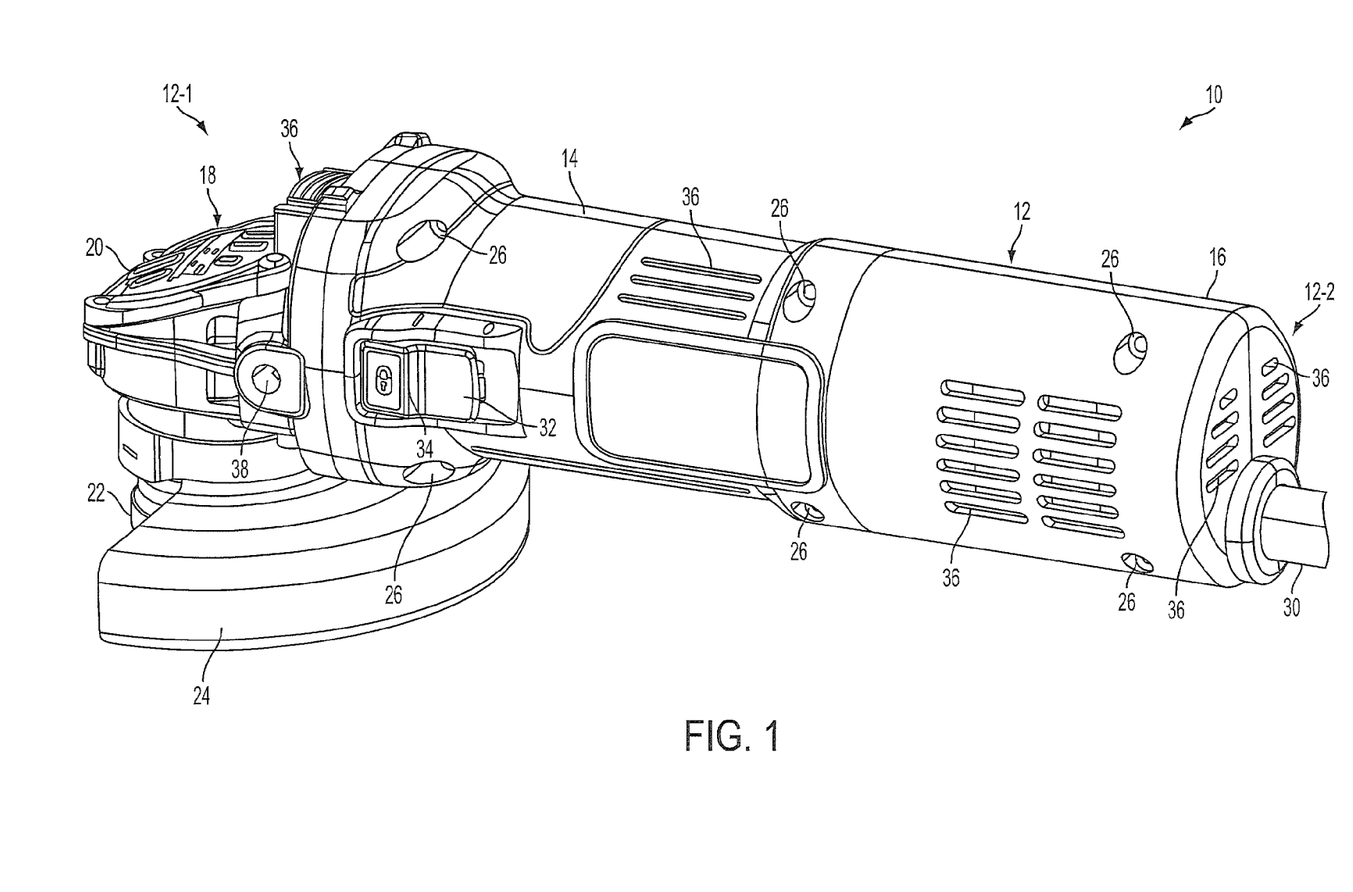
FIG. 1 is an illustration depicting a power tool.

A power tool 10 depicted in FIG. 1 comprises a housing 12 having an elongated shape and having first 14 and second 16 portions defined by the housing 12. A user can grasp the power tool 10 by placing the palm of the user's hand over and around the housing 12. An output member 18 is positioned at one end 12-1 of the housing 12 and comprises a right angle gearset 20 that drives a rotating disk 22. An adjustable guard 24 is covering at least a portion of the rotating disk 22 and obstructs sparks and debris generated during operation of the power tool 10. While the present description is provided with reference to a grinder, it is readily understood that the broader aspects of the present disclosure are applicable to other types of power tools, including but not limited to sander, drill, impact driver, tapper, fastener driver, and saw.

The first 14 and second 16 portions are secured together with screws 26, illustratively six, and enclose an electric motor 28 and electronic circuit components, as further described below, that drive the output member 18. While the present description is provided with reference to a brushless motor, the electric motor 28 may be any type of electrical motor capable of driving the output member 18. A power cord 30 is connectable to an AC power source and is positioned at opposite end 12-2 of the housing 12. The power cord 30 provides power to the electric motor 28 and the electronic circuit components of the power tool 10. The first portion 14 further includes a power on/off switch 32 and a spindle lock switch 34. Putting the power on/off switch 32 in on and off positions turns on and turns off the electric motor 28, respectively. Pressing and holding the spindle lock switch 34 enables the user to change the rotating disk 22. A plurality of narrow slot openings 36 of the first 14 and second 16 portions allow for venting of the electric motor 28 and the electronic circuit components. The one end 12-1 of the housing 12 also includes a threaded opening 38 for selectively attaching a side-handle (not shown) to enable two-handed operation.

Figure 2:
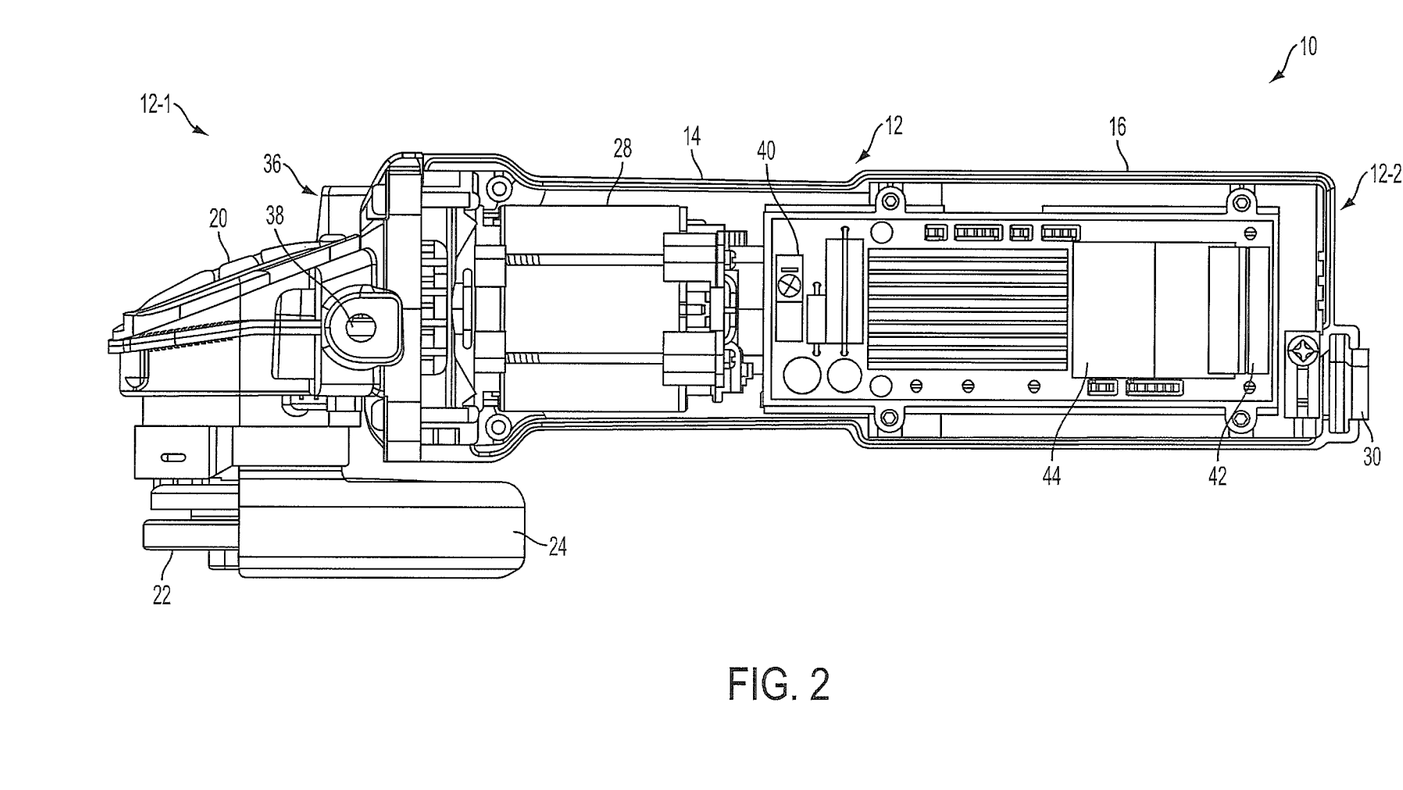
FIG. 2 is a cross-sectional view of a power tool.

FIG. 2 depicts a cross sectional view of the power tool 10 with the first portion 14 of the housing 12 removed. A plurality of electronic circuit components of the power tool 10 are configured to control the electric motor 28. The electronic circuit components generally comprise a switch contact 40 of the power on/off switch 32, a rectifier 42, DC bus capacitors 44, and, as further described below, control logic that powers and controls the electric motor 28. As mentioned above with respect to FIG. 1, the power cord 30 is connectable to an AC power source, such as AC power outlet, at AC main node and AC neutral node. The rectifier 42 converts AC voltage into DC voltage and the DC bus capacitors 44 smooth the DC line voltage.

Figure 3:
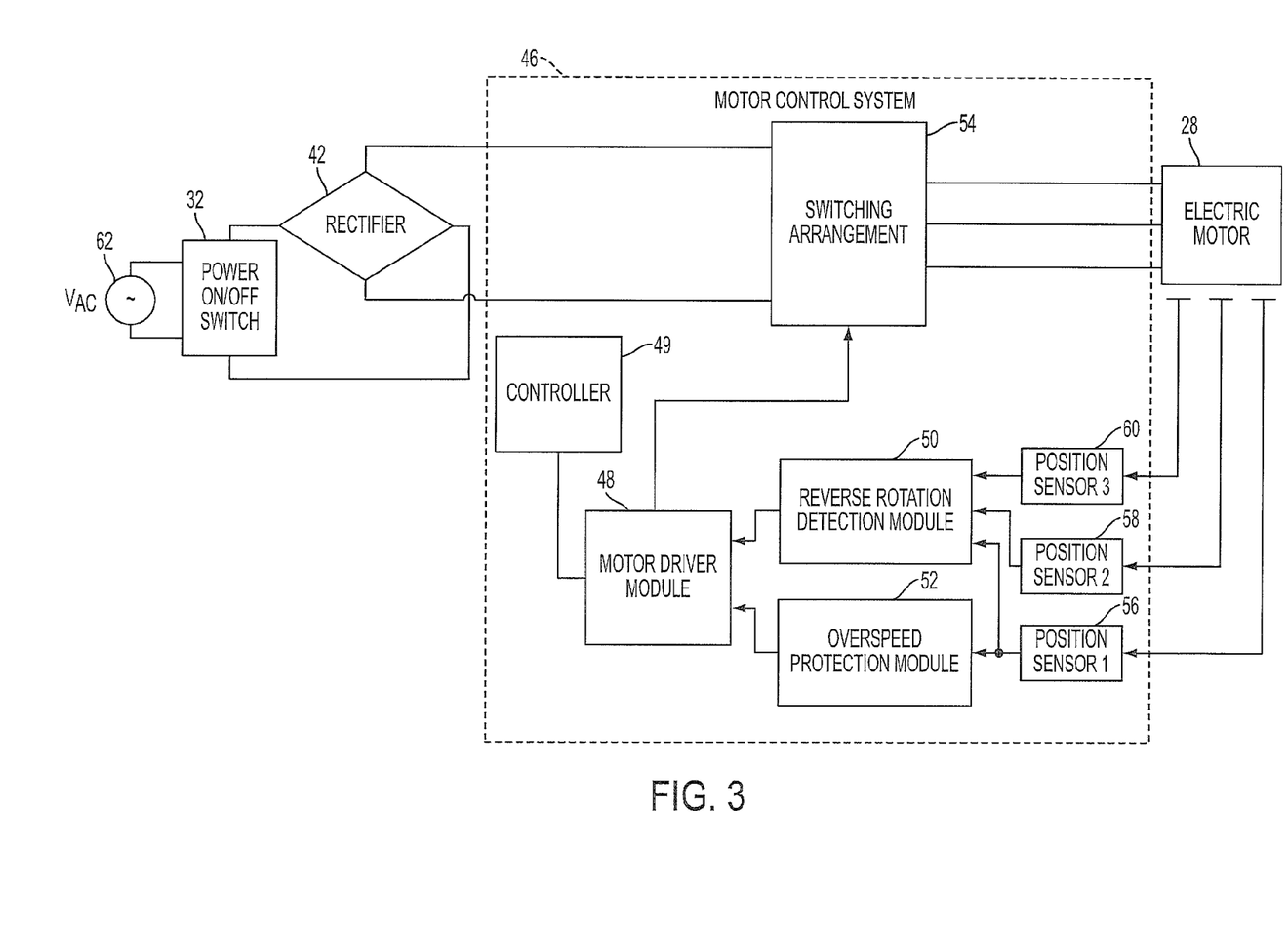
FIG. 3 is a block diagram depicting an exemplary embodiment of a motor control system having a reverse rotation detection module and an overspeed protection module.

FIG. 3 depicts an exemplary embodiment of a motor control system 46 which can be employed in a power tool. The motor control system 46 is comprised generally of a motor driver module 48, a controller 49, a reverse rotation detection module 50, an overspeed protection module 52, and a switching arrangement 54. The motor control system 46 may further include two or more position sensors 56, 58, 60. The position sensors are configured to detect rotational motion of the electric motor 28 and generate a signal indicative of the rotational motion, where the signal has a periodic waveform whose magnitude varies in accordance with the rotational position of the motor. While the following description is provided with reference to a Hall Effect sensor as a position sensor, it is readily understood that other types of position sensors (e.g., inductive sensors) are within the broader aspects of this disclosure.

In an exemplary embodiment, a rectifier 42 is connected to an AC power source 62 via a power on/off switch 32 and converts AC power line voltage input into DC voltage. The switching arrangement 54 is interposed between the electric motor 28 and the power source 62 for the tool. In particular, the switching arrangement 54 is coupled between the rectifier 42 and the electric motor 28. The controller 49 is interfaced with the motor driver module 48 and generates PWM signals to control the electric motor 28. The motor driver module 48 is interfaced with the switches (not shown) of the switching arrangement 54 and controls the switching operation of the switches. In an example embodiment, the switching arrangement 54 may be further defined as a three-phase inverter bridge although other arrangements are contemplated by this disclosure. Furthermore, the switching arrangement 54 and the motor driver module 48 may be a single integrated circuit which is commercially available from various manufactures. As used herein, the term module may refer to, be part of, or include an electronic circuit, and application specific integrated circuit (ASIC), a processor (shared, dedicated, or group) and/or memory (shared dedicated, or group) that execute one or more software or firmware programs, a combinational logic circuit, and/or other suitable components that provide the described functionality.

In the example embodiment, the power tool 10 is designed to rotate in one direction (e.g., counter-clockwise) but not in an opposite direction (e.g., clockwise). The reverse rotation detection module 50 monitors the rotational direction of the electric motor 28 and generates a shutdown signal when the electric motor rotates in a direction that is opposite the intended rotational direction. To do so, the reverse rotation detection module 50 receives signals from two or more position sensors 56, 58, 60. In one embodiment, the position sensors are Hall Effect sensors although other types of sensors may be used to detect and/or measure rotational speed of the electric motor 28. The motor driver module 48 is configured to receive the shutdown signal from the reverse rotation detection module 50 and discontinue driving the electric motor 28 in response to the shutdown signal.

The overspeed protection module 52 also monitors the rotational motion of the electric motor 28. More specifically, the overspeed protection module 52 monitors the speed of the motor and generates a shutdown signal when the speed of the motor exceeds a threshold. Likewise, the motor driver module 48 is configured to receive the shutdown signal from the overspeed protection module 52 and discontinue driving the motor in response to the shutdown signal. In one embodiment, the motor driver module 48 opens the switches in the switching arrangement in a manner that terminates motor rotation. With reference to U.S. Patent Application Publication No. 2011/0056715 which is incorporated herein in its entirety, other techniques for disabling the motor and/or the power tool are contemplated by this disclosure.

Figure 4:
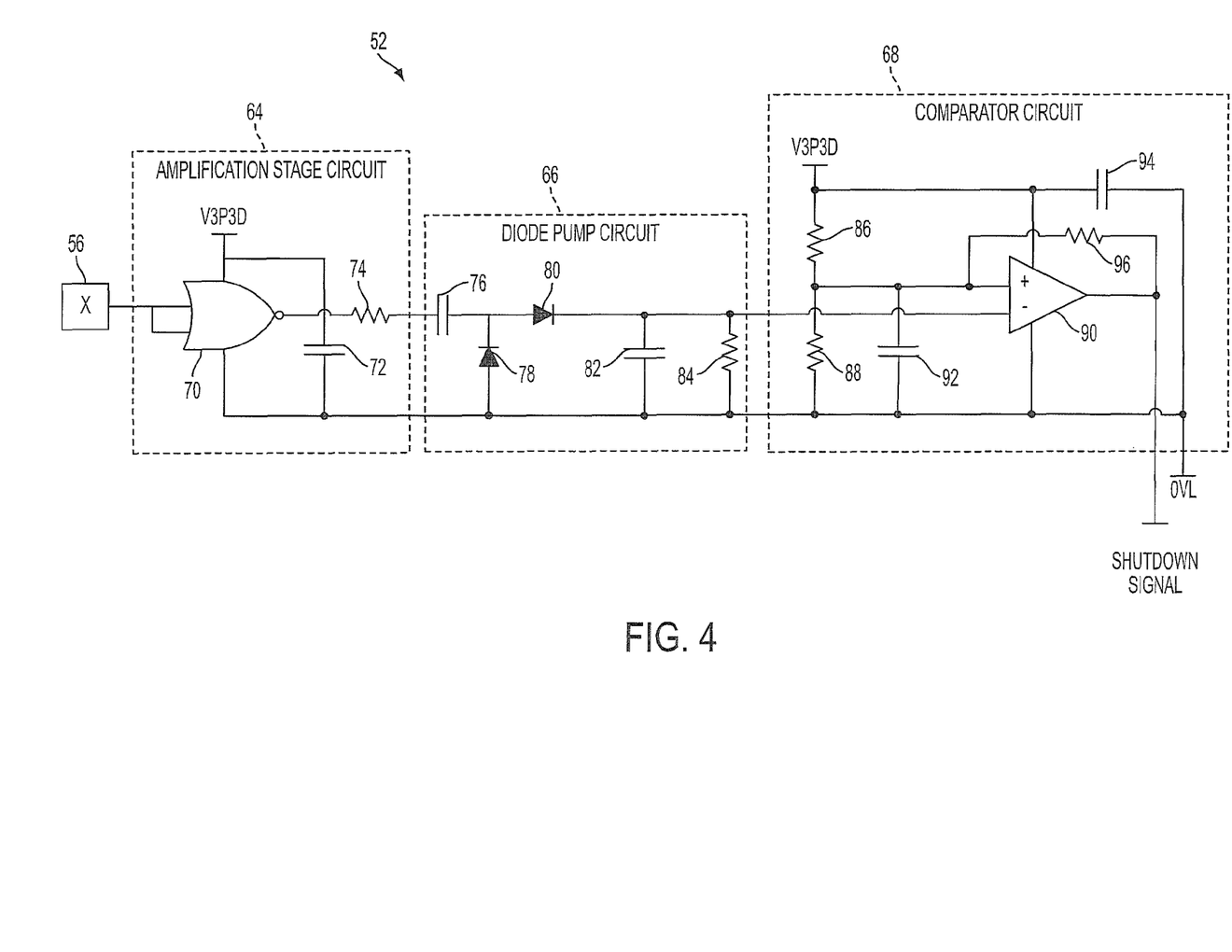
FIG. 4 is a circuit diagram for an overspeed protection module.

FIG. 4 is a schematic diagram of an exemplary embodiment for the overspeed protection module 52. The overspeed protection module 52 is comprised generally of an amplification stage circuit 64, a diode pump circuit 66, and a comparator circuit 68. It is envisioned that one or more of these circuit components may be replaced with other circuit components that provide similar functions. The diode pump circuit 66 is configured to receive a signal, via the amplification stage circuit 64, from one of the position sensors, where the signal has a periodic waveform with a frequency proportional to rotational speed of the motor. The diode pump circuit 66 operates to output a voltage proportional to the frequency of the signal. The comparator circuit 68 receives the output voltage from the diode pump circuit 66, compares the output voltage to a reference voltage, and generates a shutdown signal when the output voltage exceeds the reference voltage. The motor driver module 48 discontinues driving the motor 28 in response to receiving the shutdown signal from the comparator circuit 68.

In the exemplary embodiment, the amplification stage circuit 64 comprises a buffer 70, a capacitor 72, and a resistor 74. The buffer 70 is connected to the position sensor 56 and generates an amplified output signal in response to receiving the position sensor signal. The capacitor 72 is positioned across a DC power supply input of the buffer 70 and stabilizes a line voltage level. The resistor 74 is positioned in series with the buffer 70 output and dampens edges of the amplified output signal.

With continued reference to the exemplary embodiment in FIG. 4, the diode pump circuit 66 comprises capacitors 76, 82, diodes 78, 80, and a resistor 84 and generates a diode pump output in response to receiving the amplified output signal. The capacitor 76 is connected in series with the diode 78, comprising a diode clamp circuit. The diode clamp circuit is further connected to the capacitor 82 and to the resistor 84 via the diode 80, comprising a lossy peak detector circuit. The diode clamp circuit operates to increase voltage across the capacitor 82 in response to receiving the amplified output signal of increasing frequency. Likewise, the diode clamp circuit operates to decrease voltage across the capacitor 82 in response to receiving the amplified output signal of decreasing frequency. The resistor 84 is connected in parallel with the capacitor 82 and operates to slowly discharge the capacitor 82.

The comparator circuit 68 generally comprises resistors 86, 88, a comparator 90, capacitors 92, 94, and a resistor 96 and selectively generates a shutdown signal in response to receiving the diode pump output signal. The capacitor 94 is connected across a comparator voltage supply input and ground and stabilizes voltage level across a comparator power supply V3P3D. The resistors 86, 88 are connected across a positive input of the comparator 90 and ground and together with the comparator power supply V3P3D operate to establish a reference voltage at the positive input. The capacitor 92 is connected across the positive input of the comparator 90 and ground and operates to stabilize the reference voltage of the comparator 90. The feedback resistor 96 is connected across the positive input of the comparator 90 and output of the comparator 90. The feedback resistor 96, thus, operates to establish hysteresis for the comparator 90. The comparator circuit 68 receives the diode pump output signal at a negative input of the comparator 90. The comparator 90 compares the reference voltage to the diode pump output signal voltage. The comparator 90 generates a high value of the comparator output signal in response to the diode pump output signal voltage being less than the reference voltage. The comparator 90 generates a low value of the comparator output signal, or the shutdown signal, in response to the diode pump output signal voltage exceeding the reference voltage. The motor driver module 48 discontinues driving the motor 28 in response to receiving the shutdown signal from the comparator circuit 68.

Figure 5A:
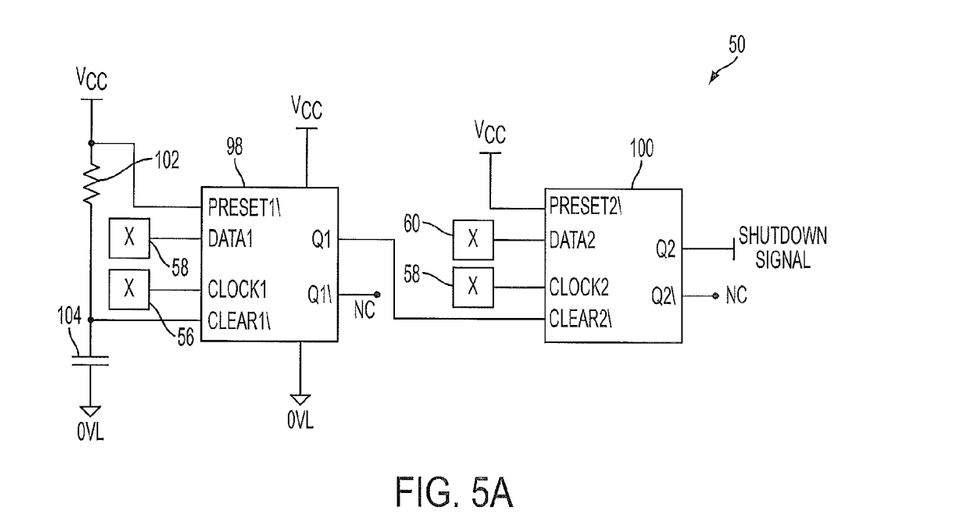
FIG. 5A is a simplified circuit diagram of an exemplary embodiment of a reverse rotation detection module.
Figure 5B:
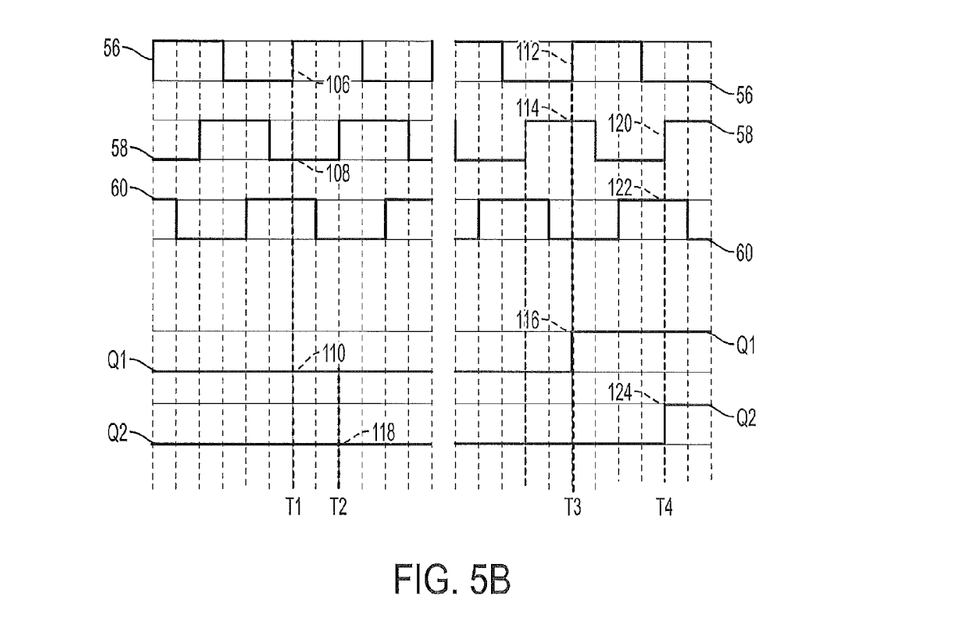
FIG. 5B is a graph depicting periodic waveforms of position sensor signals in a reverse rotation detection module.

FIG. 5A is a simplified circuit diagram depicting an exemplary embodiment of the reverse rotation detection module 50. FIG. 5B is a graph depicting exemplary periodic waveforms of the positions sensors 56, 58, 60 in the reverse rotation detection module 50. The reverse rotation detection module 50 is comprised generally of a first latch circuit 98 and a second latch circuit 100. It is envisioned that one or more of these circuit components may be replaced with other circuit components that provide similar functions. The first 98 and second 100 latch circuits are connected in series and generate the first (Q1) and second (Q2) latch output signals, as illustrated in FIG. 5B.

The first latch circuit 98 is configured to receive a first signal from a first one of the position sensors and a second signal from a second one of the position sensors and operates to generate an output state indicative of sequence of magnitude variations in the first signal relative to magnitude variations in the second signal. In the exemplary embodiment, the first latch circuit 98 is configured to receive the first position sensor signal at a Clock1 input and to receive the second position sensor signal at a Data1 input. The first latch circuit 98 selectively generates a high or a low value of the first latch output signal (Q1). The first latch circuit 98 generates a low value of the output signal in response to detecting a rising edge of the signal at the Clock1 input and detecting a low value of the signal at the Data1 input. This point is further illustrated in FIG. 5B, where the rising edge of the first position sensor signal at point 106 and the low value of the second position sensor signal at point 108 result in low value of the first latch output signal (Q1), see point 110 on the graph.

Furthermore, the first latch circuit 98 generates a high value of the output signal (Q1) in response to detecting a rising edge of the signal at the Clock1 input and detecting a high value of the signal at the Data1 input. This point is further illustrated in FIG. 5B, where the rising edge of the first position sensor signal at point 112 and the high value of the second position sensor signal at point 114 result in high value of the first latch output signal (Q1), see point 116 on the graph. Resistor 102 and capacitor 104 are connected in series with each other and are further connected across the Clear1\ input of the first latch circuit 98 and ground. The resistor 102 and capacitor 104 operate to reset the first latch circuit 98 in response to initial application of supply voltage Vcc.

Continuing with respect to FIGS. 5A and 5B, the second latch circuit 100 is configured to receive the second signal from the second one of the position sensors, a third signal from a third one of the position sensors and the output state from the first latch circuit 98. The second latch circuit 100 operates to generate a shutdown signal in accordance with sequence of magnitude variations in the first latch output signal in relation to magnitude variations in the second and third signals. In the exemplary embodiment, the second latch circuit 100 is connected to activate in response to receiving a high value of the first latch output signal (Q1) at a Clear2\ input. Point 118 in FIG. 5B indicates that second latch output signal (Q2) will remain at a low value in response to receiving a low value of the first latch output signal (Q1). Activation of the second latch circuit 100 is illustrated in FIG. 5B where the second latch circuit 100 activates in response to receiving a high value of the first latch output signal (Q1) at point 116. The second latch circuit 100 is further configured to receive the second and third position sensor signals at Clock2 and Data2 inputs, respectively. When activated, the second latch circuit 100 operates analogous to the first latch circuit 98 in that it selectively generates a high or a low value of the second latch output signal (Q2).

Further describing the operation of the second latch circuit 100 after it activates in response to receiving a high value of the first latch output signal (Q1) at a Clear2\ input. For example, the second latch circuit 100 generates a low value of the second latch output signal (Q2) in response to detecting a rising edge of the signal at the Clock2 input and detecting a low value of the signal at the Data2 input. On the other hand, the second latch circuit 100 generates a high value of the second latch output signal (Q2), or a shutdown signal, in response to detecting a rising edge of the signal at the Clock2 input and detecting a high value of the signal at the Data2 input. As illustrated in FIG. 5B the second latch output signal (Q2) achieves a high value at point 124 in response to detecting a rising edge of the signal at the Clock2 input at point 120 and a high value of the signal at the Data2 input at point 122. The motor driver module 48 discontinues driving the motor 28 in response to receiving the shutdown signal from the second latch circuit 100.

Table 1 is a truth table for the latch circuits as in the exemplary embodiment. Designation "DC" ("don't care") in the truth table indicates that the logic gate does not read the state of Data and Clock inputs given particular states of Clear\ and Preset\ inputs. In one embodiment the reverse rotation detection is accomplished with two latches, although in other embodiments one latch circuit may be used to detect reverse rotation of the electric motor 28. Furthermore, while in one embodiment the latch circuits are flip-flops, it is generally understood that other configurations of logic gates may be used to detect reverse rotation of the electric motor 28. It is also generally understood that the latch circuits, similar to an exemplary embodiment, can be implemented using a microprocessor.

TABLE 1

| Clear\ | Preset\ | Data | Clock | Q | Q\ | Function |
|---|---|---|---|---|---|---|
| Low | High | DC | DC | Low | High | Clear |
| High | Low | DC | DC | High | Low | Preset |
| Low | Low | DC | DC | High | High | Unstable |
| High | High | Low | Rising | Low | High | Clock Low |
| High | High | High | Rising | High | Low | Clock High |
| High | High | DC | Falling | Previous | Previous | No Change |

Figure 6:
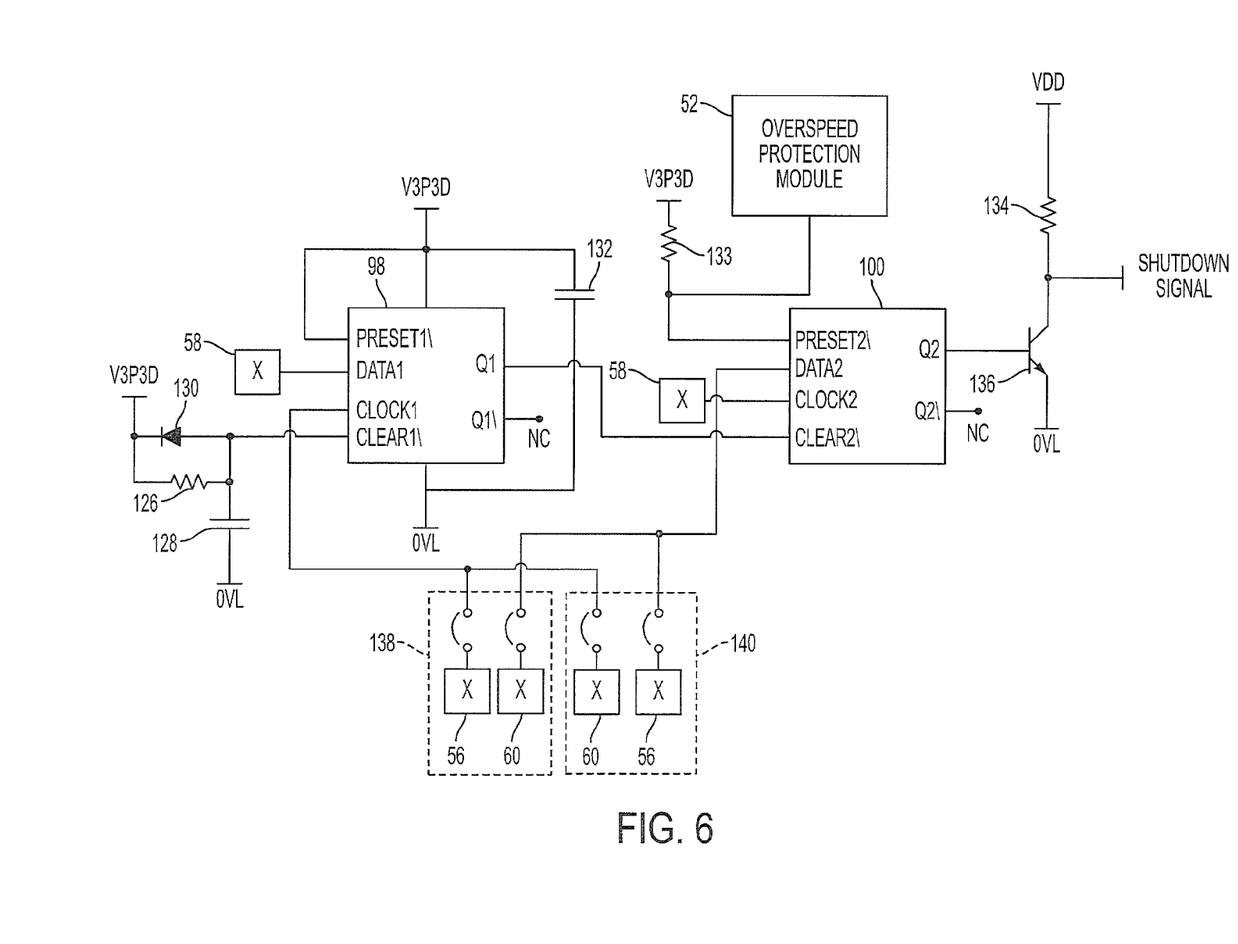
FIG. 6 is a circuit diagram of an exemplary embodiment of a combination of an overspeed protection module and a reverse rotation detection module.

FIG. 6 is a circuit diagram of an exemplary embodiment of the combination of the overspeed protection module 52 and the reverse rotation detection module 50. As previously detailed in reference to FIG. 4, the overspeed protection module 52 monitors the speed of the motor 28 and generates a shutdown signal when the speed of the motor exceeds a threshold. More specifically, the comparator 90 of the overspeed protection module 52 compares the reference voltage at the positive input to the diode pump output signal voltage at the negative input. The comparator 90 generates a high value of the comparator output signal in response to the diode pump output signal voltage being less than the reference voltage. The comparator 90 generates a low value of the comparator output signal, or the shutdown signal, in response to the diode pump output signal voltage exceeding the reference voltage.

The second latch circuit 100 is configured to receive a high or a low value of the comparator output signal at the Preset2\ input. The second latch circuit 100 generates a low value of the output signal (Q2) in response to receiving a high value of the comparator output signal. The second latch circuit 100 generates a high value of the output signal (Q2), or the shutdown signal, in response to receiving a low value of the comparator output signal at the Preset2\ input. A bipolar junction transistor 136 conducts in response to receiving a high value of the second latch output signal (Q2), or the shutdown signal. The motor driver module 48 discontinues driving the motor 28 in response to receiving the shutdown signal from the second latch circuit 100 via the bipolar junction transistor 136.

Additionally, the first 98 and second 100 latch circuits of the reverse rotation detection module 50 operate as detailed above in reference to FIGS. 5A and 5B. A resistor 126 and a capacitor 128 are connected in series with each other and are further positioned between the Clear1\ input of the first latch circuit 98 and ground. The resistor 126 and the capacitor 128 operate to reset the first latch circuit 98 in response to initial application of the supply voltage. A fast switching diode 130 is connected in parallel with the resistor 126 and operates to discharge the capacitor 128 in response to cessation of the supply voltage. A capacitor 132 is connected across the reference voltage input and ground and operates to decouple the power supply from the first latch circuit 98. A resistor 133 is connected in series with the power supply circuit V3P3D and operates to decouple the power supply from the second latch circuit 100. A resistor 134 is positioned in series with reference voltage source VDD and operates to pull collector of the bipolar junction transistor 136 to VDD potential in response to cessation of conduction of the bipolar junction transistor 136. Connection housings 138, 140 house alternative connection configurations of the position sensors 56, 60, the first latch circuit 98, and the second latch circuit 100. The alternative connection configurations allow the power tool 10 to be configured such as to prevent rotation in the first direction but allow rotation in the second opposite direction or, in the alternative, such as to prevent rotation in the second opposite direction but allow rotation in the first direction.

Figure 7:
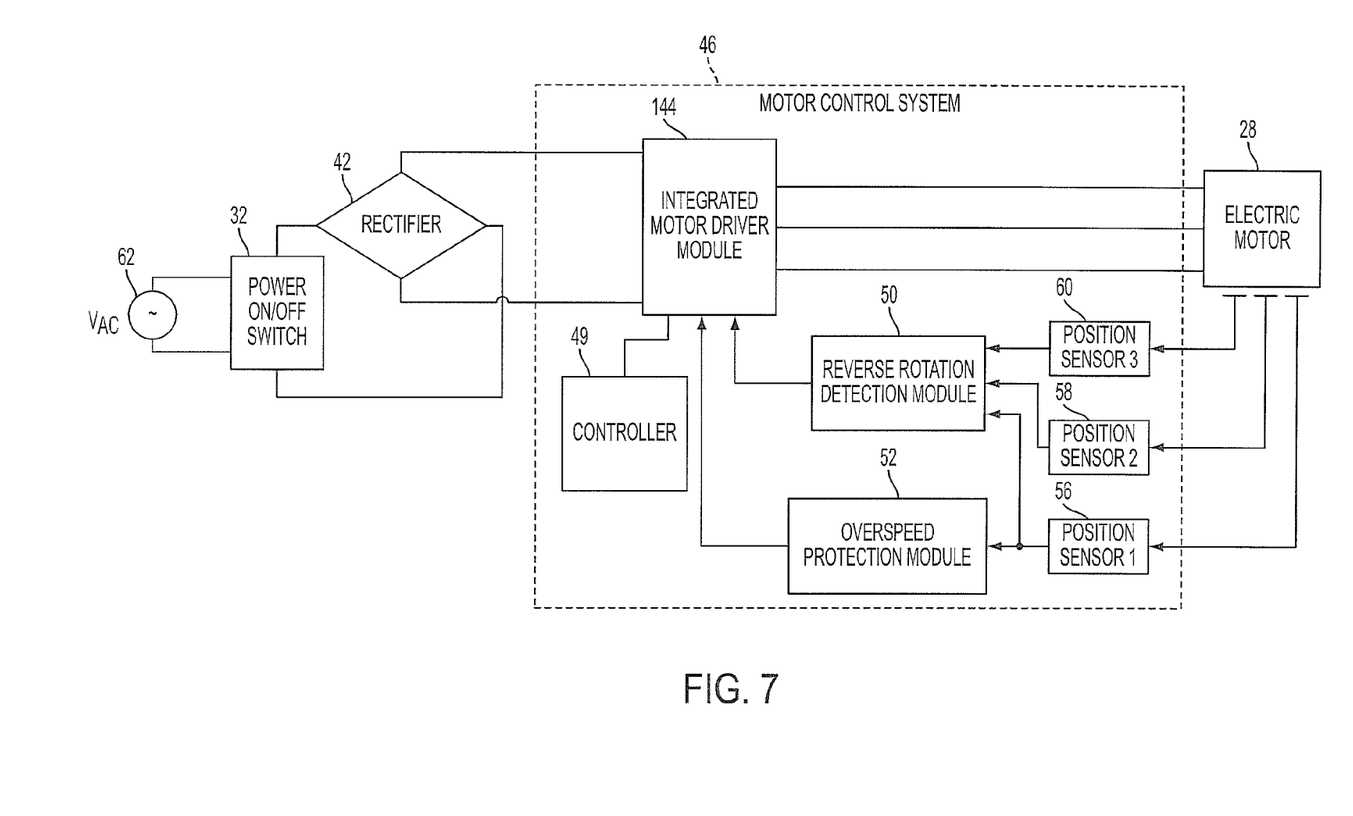
FIG. 7 is a block diagram depicting a variation of an exemplary embodiment of a motor control system having a reverse rotation detection module and an overspeed protection module.

FIG. 7 depicts a variation of an exemplary embodiment of the motor control system 46 having the reverse rotation detection module 50 and the overspeed protection module 52. More specifically, FIG. 7 depicts a block diagram of the motor control system 46 having an integrated motor module 144. The integrated control module 144 is positioned between the rectifier 42 and the electric motor 28 and is interfaced with the controller 49. The integrated control module 144 comprises the switching arrangement 54 and the motor driver module 48. The reverse rotation detection module 50 generates a shutdown signal in response to determining that the electric motor 28 is rotating in the second opposite direction. The overspeed protection module 52 generates a shutdown signal in response to determining that the electric motor 28 is rotating at a speed higher than a threshold speed. The integrated motor driver module 144 operates to disable the electric motor 28 in response to receiving the shutdown signal from either the reverse rotation detection module 50 or the overspeed protection module 52.

Figure 8:
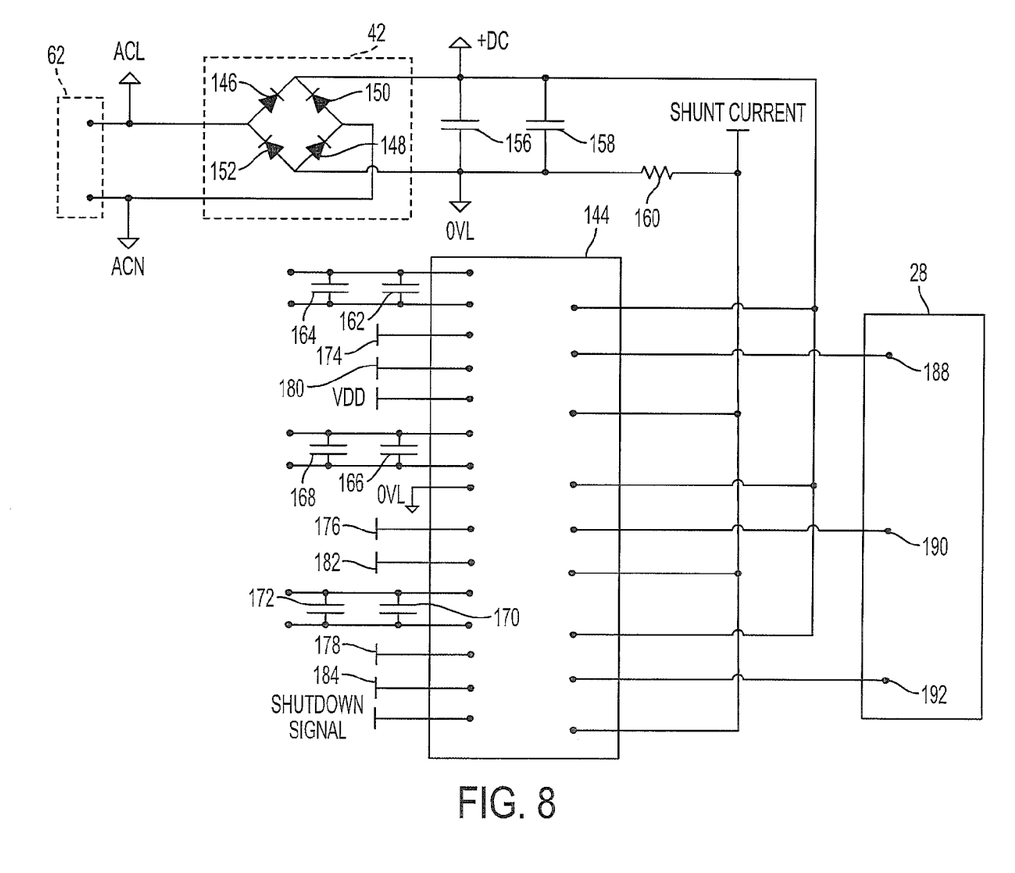
FIG. 8 is a circuit diagram depicting an exemplary embodiment of a motor control system having an integrated motor driver module.

FIG. 8 is a circuit diagram depicting an exemplary embodiment of the motor control system 46 having the integrated motor driver module 144. The integrated motor driver module 144 generally comprises six transistors (not shown) arranged in an inverter bridge configuration. Each phase 188, 190, 192 of the three-phase electric motor 28 connects to a pair of transistors. The first, third, and fifth transistors are connected between the first 188, second 190, and third 192 phases, respectively, and power. The first, third, and fifth transistors comprise high-side switches capable of generating a varying average voltage across the electric motor 28 in response to receiving a PWM signal of varying duty cycle. The second, fourth, and sixth transistors are connected between the first 188, second 190, and third 192 phases, respectively, and ground. The second, fourth, and sixth transistors comprise the low-side switches capable of generating a varying average voltage across the electric motor 28 in response to receiving the PWM signal of varying duty cycle. The electric motor 28 rotates in response to sequentially receiving voltage across one of the high-side switches of one phase and across one of the low-side switches of another phase. The integrated motor driver module 144 disables the six switches in response to receiving the shutdown signal.

In the exemplary embodiment, the rectifier 42 comprises diodes 146, 148, 150, 152 in a full-bridge rectifier configuration. The rectifier 42 operates to convert AC line voltage to DC voltage and to power the integrated motor driver module 144. Capacitors 156, 158 are positioned across a rectifier output and operate to smooth voltage ripple. A shunt resistor 160 provides a low resistance path for measuring electric current as an analog voltage.

The integrated power control module 144 is positioned between controller 49 (not shown) and the electric motor 28. The controller 49 generates PWM signal to control the electric motor 28 and supplies the PWM signal to the integrated power control module 144 via logic inputs as described below. Bootstrapping capacitors 162, 164 are positioned across a first phase bootstrap voltage input and a first phase high side reference output of the integrated motor driver module 144. The bootstrapping capacitors 162, 164 supply voltage differential to drive the first phase of the electric motor 28. The bootstrapping capacitors 166, 168 and bootstrapping capacitors 170, 172 operate similarly to the bootstrapping capacitors 162, 164 across the second and third phases, respectively. Low-side logic inputs 174, 176, 178 and high-side logic inputs 180, 182, 184 of the integrated motor driver module 144 activate and deactivate in response to receiving the PWM signal. The plurality of switches close and open in response to receiving the PWM signal via the 174, 176, 178, 180, 182, and 184 logic inputs. The integrated motor driver module 144 shuts down the plurality of transistors turning off the electric motor 28 in response to receiving the shutdown signal.

Figure 9:
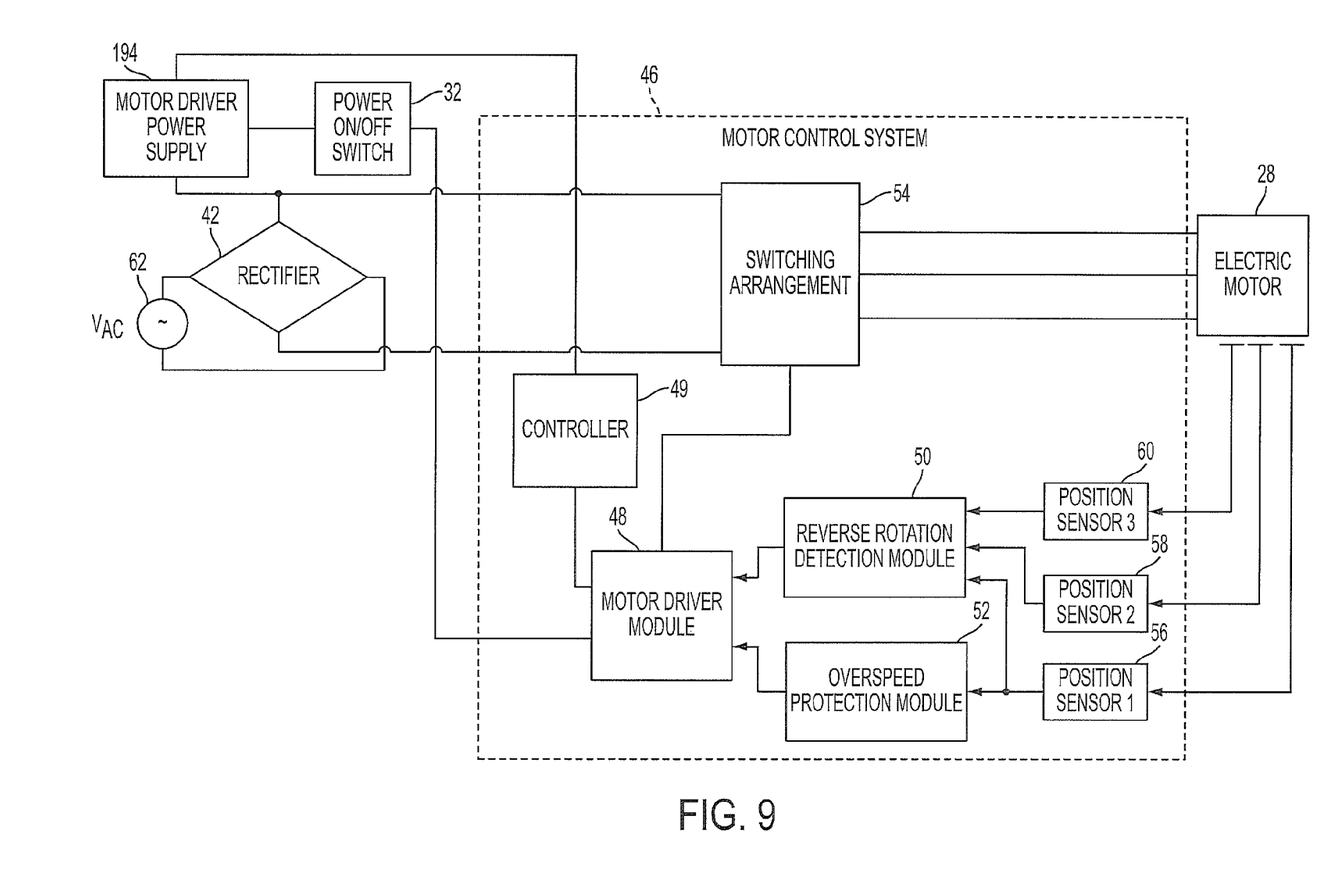
FIG. 9 is a block diagram depicting a variation of an exemplary embodiment of a motor control system having a power on/off switch that is positioned between a motor driver power supply and a motor driver module.

FIG. 9 depicts a variation of an exemplary embodiment of the motor control system 46 having the reverse rotation detection module 50 and the overspeed protection module 52. More specifically, FIG. 9 depicts the power on/off switch 32 that is positioned such that the power from the AC power supply 62 does not pass through the power on/off switch 32. The power on/off switch 32 is further positioned between a motor driver power supply 194 and the motor driver module 48. The motor driver power supply 194 is connected in series with the rectifier 42 and operates to power the motor driver module 48 via the power on/off switch 32. Specifically, in response to being put in off position, the power on/off switch 32 operates to disable the connection between the motor driver power supply 194 and the motor driver module 48 and thereby operates to shut down the electric motor 28. Conversely, in response to being put in on position, the power on/off switch 32 operates to enable the connection between the motor driver power supply 194 and the motor driver module 48 and thereby operates to turn on the electric motor 28.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A power tool having an electric motor intended to rotate in a first direction but not in an opposite second direction, comprising:
    an elongated housing configured to be grasped by a user;
    an output shaft at least partially contained in the housing;
    an electric motor residing in the housing and drivably connected to the output shaft to impart rotary motion thereto;
    a switching arrangement having a plurality of motor switches and interposed between the electric motor and a power source;
    three position sensors, each position sensor configured to detect rotational motion of the electric motor and generate a signal having a periodic waveform whose magnitude varies in accordance with rotational position of the motor;
    a first latch circuit configured to receive a first signal from a first one of the position sensors and a second signal from a second one of the position sensors and operates to generate an output state indicative of sequence of magnitude variations in the first signal relation to magnitude variations in the second signal;
    a second latch circuit configured to receive the second signal from the second one of the position sensors, a third signal from a third one of the position sensors and the output state from the first latch circuit, the second latch circuit operates to generate a shutdown signal in accordance with sequence of magnitude variations in the first latch output signal in relation to magnitude variations in the second and third signals; and
    a motor driver module interfaced with the motor switches and operable to control switching operation of the motor switches, wherein the motor driver module is configured to receive the shutdown signal from the second latch circuit and discontinue driving the motor in response to the shutdown signal.

2. The power tool of claim 1 wherein the first signal serves as a clock signal for the first latch circuit.

3. The power tool of claim 2 wherein the first latch circuit generates an output state having a high value in response to the second signal having a high value during a rising edge of the first signal and generates an output state having a low value in response the second signal having a low value during a rising edge of the first signal.

4. The power tool of claim 3 wherein the second signal serves as a clock signal for the second latch circuit.

5. The power tool of claim 4 wherein the second latch circuit monitors the sequence of magnitude variations in the second and third signals in response to receiving an output state with a high value from the first latch circuit.

6. The power tool of claim 5 wherein the second latch circuit generates the shutdown signal with a high value in response to the third signal having a high value during a rising edge of the second signal.

7. The power tool of claim 1 wherein the first latch circuit and the second latch circuit are further defined as D-type latch circuit.

8. The power tool of claim 7 further comprises a resistor having a first terminal coupled to a set input of the first latch circuit and a second terminal coupled to a capacitor and a reset input of the first latch circuit.

9. The power tool of claim 2 wherein the position sensors are further defined as Hall Effect sensors.

* * * * *